United States Patent [19]
Reijnders

[11] 3,873,943
[45] Mar. 25, 1975

[54] LOW-DISTORTION CONSTANT-AMPLITUDE OSCILLATOR

[75] Inventor: Joseph Lodewijk Maria Reijnders, Emmasingel, Eindhoven, Netherlands

[73] Assignee: U.S. Philips Corporation, New York, N.Y.

[22] Filed: Aug. 17, 1973

[21] Appl. No.: 389,318

[30] Foreign Application Priority Data
Sept. 19, 1972 Netherlands .................... 7212655

[52] U.S. Cl. .............................. 331/141, 331/183
[51] Int. Cl. .......................................... H03b 5/26
[58] Field of Search ........... 331/109, 110, 141, 142, 331/140, 183

[56] References Cited

UNITED STATES PATENTS

| | | | |
|---|---|---|---|
| 3,137,826 | 6/1964 | Boudrias | 331/109 |
| 3,339,156 | 8/1967 | Niedereder | 331/141 |

FOREIGN PATENTS OR APPLICATIONS

| | | | |
|---|---|---|---|
| 1,438,051 | 6/1965 | France | 331/142 |

OTHER PUBLICATIONS

EEE, J. Potzick, pg. 130, Mar. 1970.
Electronic Design, pg. 82, Feb. 15, 1973.

*Primary Examiner*—John Kominski
*Attorney, Agent, or Firm*—Frank R. Trifari; Bernard Franzblau

[57] ABSTRACT

An oscillator circuit is proposed, which has a low distortion, a good amplitude stability, a very low self-modulation and which is of simple design. For instantaneous variations use is made of an amplifier circuit which operates in the linear region and which has a gain factor which is smaller than is required for undamping, and a source of auxiliary oscillations, which provides the excitation of the oscillator circuit. The constant excitation is preferably derived from the oscillator output voltage.

10 Claims, 9 Drawing Figures

LOW-DISTORTION CONSTANT-AMPLITUDE OSCILLATOR

The invention relates to a low-distortion oscillator which comprises frequency selective means, an amplifier circuit connected thereto and a slow-acting amplitude control, sinusoidal oscillations of a given amplitude being produced by undamping of the frequency selective means.

Frequency selective means may be two or three terminal networks which at a certain frequency have a characteristic point in their amplitude and/or phase diagram. By utilizing this point and connecting an amplifier with a specific gain factor to said frequency selective means, oscillations may be produced and sustained whose frequency corresponds to the frequency associated with said characteristic point in the amplitude or phase diagram.

Thus, a parallel LCR-circuit will sustain an oscillation at its resonant frequency when the amplifier undamps said ciruit, i.e., the damping effect of the resistance R is cancelled by the amplifier or the loop gain is high enough to sustain undamped oscillations. Similarly, an oscillation will be sustained in an R-C bridge-circuit, known by the name Wien bridge, when an amplifier is connected between the bridge centre and the bridge supply points. At a certain frequency the voltage which is available at the bridge centre has a maximum amplitude and zero phase shift relative to the bridge supply voltage. It is also known to cascade three RC-networks so that a phase shift of three times 60° is obtained at one frequency, or to combine two networks which each cause a 90° phase-shift for one frequency. Amplifier elements including a feedback loop provide a complementary 180° phase shift so that with sufficient gain an oscillation is sustained.

A problem associated with every oscillator of the above stated type is that the amplitude stability is adjusted at the expense of a slight distortion of the sinusoidal oscillation produced.

The oscillation requirement as described hereinbefore does not provide any information on the amplitude of the sinusoidal oscillation. Slight variations in the circuit components, mainly those of the amplifier, will cause the oscillation to decay or to increase. To obtain a fixed amplitude value a control loop should be provided. Usually amplitude limiting circuits are used for this purpose, which generally employ the amplitude limiting properties of the amplifier itself. Control amplifiers are also used whose gain is controlled by a rectifier which compares the rectified output voltage of the oscillator with a reference value.

It is also known to incorporate variable resistors in the negative feedback paths in the amplifier which are responsive to the peak-peak value of the sinusoidal oscillation, or to the r.m.s. value by development of heat. An example of such an oscillator circuit is given in German Patent Specification No. 926,857 by Gerhard Clamann and Werner Grahnet.

In the Hewlett-Packard Journal, Volume 11, No. 8–10 of April-June 1960 in the article "The effect of $\mu$-circuit non-linearity on the amplitude stability of RC oscillators" a step is described to stabilise the oscillator amplitude by means of a non-linearity of the amplifier in the operating point, which operating point is adjusted by means of a thermally sensitive negative feedback resistance in the amplifier.

Both publications describe an oscillator circuit with a slow control of the operating point and a fast control by means of a non-linear gain near said operating point.

The invention is based on the recognition that this principle is also applicable but with a linear gain about the operating point, thus providing the advantages of a good amplitude stability both for slow and rapid variations and a very low distortion of the sinusoidal oscillation produced.

For this purpose use is made of an excitation by means of a source of auxiliary oscillations of the frequency to be generated and a linear amplifier.

Acccording to the invention an oscillator of the type mentioned in the preamble is characterized in that for instananeous changes the amplifier circuit is operated in the linear region and has a gain factor which is smaller than the gain factor required for undamping and that the oscillator comprises a source of auxiliary oscillations of the same frequency as the sinusoidal oscillations and of constant amplitude, which source is connected to the amplifier circuit and, in conjunction with the slow-acting amplitude control, also determines the value and stability of the amplitude of the sinusoidal oscillations.

In one embodiment the source of auxiliary oscillations is supplied with frequency information from the output of the oscillator and the auxiliary source supplies its information in the form of amplitude-limited positive feedback to the amplifier circuit.

In a suitable embodiment the source of auxiliary oscillations is an instantaneous limiter consisting of a resistor, connected to the output of the oscillator, in series with two diodes arranged in anti-parallel, across which a squarewave voltage of the oscillator frequency and of fairly constant amplitude is generated. Said voltage is fed back regeneratively to an input of the amplifier circuit as excitation.

The invention will now be described in more detail, by way of example, with reference to the accompanying drawing in which.

Figure 1:
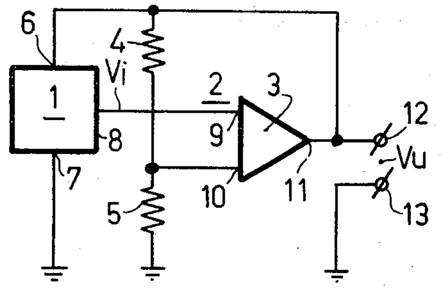
FIG. 1 is a block diagram of a known oscillator circuit.

The blocks in FIG. 1 show how an oscillator of the known type is arranged. Block 1 represents the frequency-selective means whose connection 7 is connected to the oscillator ground. The amplifier circuit 2, consisting of an amplifier 3 with inputs 9 and 10 and output 11, is connected to the frequency-selective means 1, for which a supply point 6 is connected to the output 11 and a detection point 8 to the input point 9. The amplifier circuit 2 has a fixed gain factor G which is mainly determined by the resistors 4 and 5, which are connected to the output 11 and ground as a voltage divider. The junction between resistors 4 and 5 is connected to the amplifier input 10. The oscillator has two output terminals 12 and 13 which are connected to the output 11 and ground. It is assumed that the amplifier 3 includes the associated power supplies.

Figure 2:
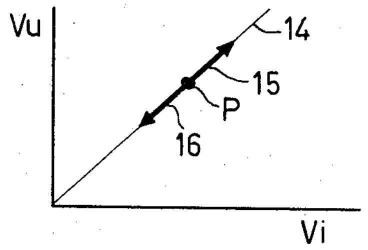
FIG. 2 shows the output voltage/input voltage characteristic of the amplifier circuit of FIG. 1.

FIG. 2 shows the characteristic associated with the oscillator of FIG. 1. The effective value of the output voltage $V_u$ is plotted on the vertical axis, the input voltage $V_i$, which develops at the detection point 8 and which is supplied to the amplifier input 9, is plotted on the horizontal axis. A straight line 14 from the origin represents the ratio $V_u/V_i$ as defined by the means 1 at the oscillator frequency. Assuming that the phase of $V_u$ and $V_i$ is correct, and for the oscillator circuit of FIG. 1 this phase should be 180° or 360°, the gain G of the amplifier circuit 2 should also equal $V_u/V_i$ to produce an oscillation in the oscillator. Theoretically, the sinusoidal oscillations may then attain an amplitude which is, for example, given by the point P on the line 14 in FIG. 2. However, in practice very small deviations of the gain G will cause the value of $V_u$ to change, as indicated, on the line 14 in the direction 16 or in the direction 15.

For amplitude stabilisation it is desirable to define the point P on the line 14.

Figure 3:
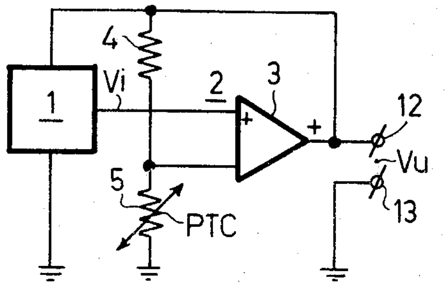
FIG. 3 shows a known oscillator with PTC-control.

For this purpose FIG. 3 shows the block diagram of FIG. 1 in which the resistor 5 is replaced by a resistor having a positive temperature coefficient, PTC.

Figure 4:
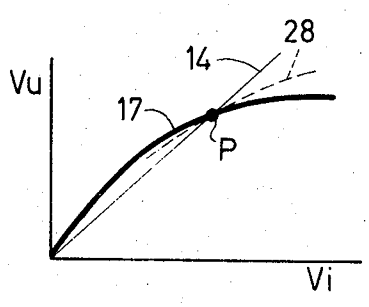
FIG. 4 shows the diagram associated with FIG.3.
Figure 5:
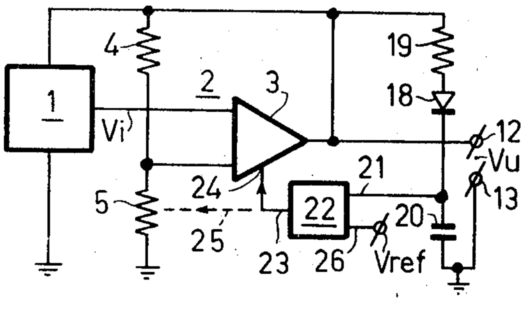
FIG. 5 is a known oscillator with peak-detection control.
Figure 6:
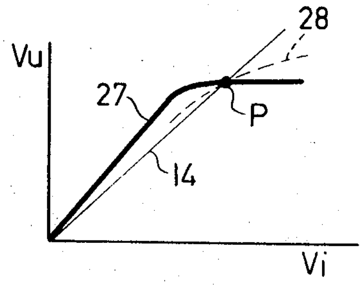
FIG. 6 shows the diagram associated with FIG. 5.

FIG. 4 shows the associated diagram. As in FIG. 2, the oscillation requirement is represented by the line 14. The gain factor G of the amplifier circuit 2 is represented by the curve 17. In the case of small drive signals G is too high, so that in any case the oscillator will start to oscillate. At an increasing voltage $V_u$ the PTC resistor 5 in FIG. 3 will become warmer so that its resistance increases, as a result of which the negative feedback, which is determined by the resistors 4 and 5 (PTC), increases and the gain G decreases. As is shown in FIg. 4 the curve 17 intersects the line 14 at point P so that the amplitude of the voltage $V_u$ will be stabilised. For the purpose of illustration FIG. 5 shows a different control system, which again is based on the block diagram of FIG. 1. The voltage $V_u$ is rectified, for example by the diode 18, which via the limiting resistor 19 charges the capacitor 20 to the peak value of $V_u$. The direct voltage obtained at the capacitor 20 is fed to an input 21 of a comparator 22, which compares said voltage with a reference voltage $V_{ref}$ at an input 26. Depending on the difference the comparator 22 supplies a signal to the output 23, to which a control input 24 of the amplifier 3 is connected. Thus, the gain factor G of the amplifier circuit 2 is controlled so as to obtain a virtually constant output voltage $V_u$. In FIG. 6 this is indicated by the curve 27, which after an initial gain extends in a horizontal direction, and as in FIG. 4 intersects the line 14 at the operating point P. A dash line 25 in FIG. 5 indicates that is is also possible to use controllable resistors instead of a fixed resistor 5. In this case the amplifier 3 does not require the control input 24 and may be of a simpler design, for example a modular operational amplifier. Generally, light-dependent resistors or transistors, such as FET's, are used as controllable resistors.

A drawback of the oscillator circuits of FIG. 3 and FIG. 5 is that the control system is slow. This means that the control system responds to slow variations, but for rapid variations $V_u$ can vary as is indicated in FIg. 2 by the lines 15 and 16. Solutions to this problem are discussed in the previously mentioned publications. In FIGS. 4 and 6 of the present Application a dash line 28 indicates the result obtained by the known solutions. Owing to the non-linearities which are introduced in the amplifier circuit rapid variations do not follow the line 14, but instead follow the line 28. The gain factor decreases at increased drive. As a result, the sinusoidal oscillations which are produced are distorted.

Figure 7:
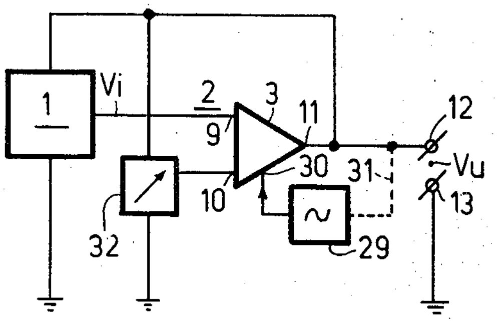
FIg. 7 shows an oscillator circuit according to the invention.
Figure 9:
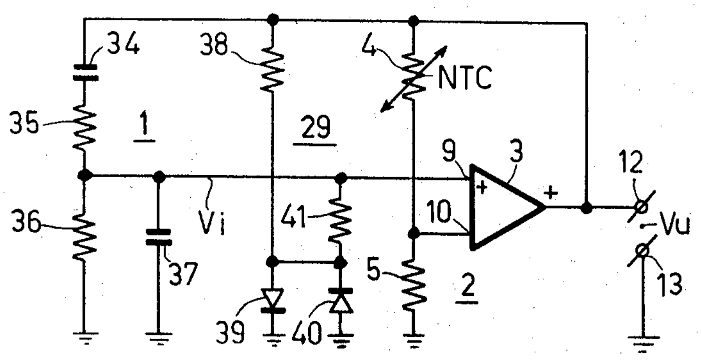
FIG. 9 shows a Wien-bridge oscillator according to the invention.

When strict requirements are imposed as regards low distortion (order of magnitude of $10^{-3}$ to $10^{-4}$), the voltage $V_u$ should also be constant, and the correct, set frequency should be attained rapidly when the frequency range is changed, the invention provides an oscillator circuit, of which FIG. 7 shows a block diagram and FIG. 9 an elaborate diagram. FIg. 7 is based on the block diagram of FIG. 3 or 5. The slow control is symbolically represented by the block 32. To elaborate the concept underlying the invention a source of auxiliary oscillations 29 is added in FIG. 7. The latter supplies a signal of the correct phase and of constant amplitude to the input 30 of amplifier 3. It is also possible to use one of the inputs 9 or 10 for this purpose, depending on the phase.

The source of auxiliary oscillations, which has the same frequency as that of the oscillations to be generated, may also be passive. In view of this, the line 31 is shown in FIG. 7, which represents a connection from the output of amplifier 3 to the source 29 for supplying frequency information.

FIG. 9 shows a simple Wien bridge oscillator embodying the step according to the invention. The frequency selective part 1 comprises the capacitor 34 in series with the resistor 35, in series with the parallel connection of resistor 36 and capacitor 37. The amplifier circuit 2 comprises the amplifier 3 and negative feedback resistors 4 and 5, resistor 4 being a resistor with a negative temperature coefficient (NTC). The operation is identical to that of the circuit of FIG. 3. The source of auxiliary oscillations 29 consists of a resistor 38 in series with two diodes 39 and 40 which are connected in anti-parallel. The auxiliary oscillation source is supplied with the voltage $V_u$. The limited squarewave voltage, which is developed across the diodes, is fed back regeneratively to the input 9 of amplifier 3 via a resistor 41, thus providing an excitation of constant amplitude. When the oscillator is switched on it will initially operate in accordance with the principle of the oscillator of FIG. 3, the corresponding diagram of which is shown in FIG. 4. However, as soon as the limiting action across the diodes 39 and 40 in FIG. 9 commences at increasing voltage $V_u$, the curve of FIG. 4 is shifted.

Figure 8:
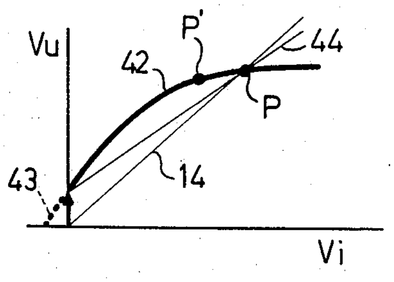
FIG. 8 shows a diagram associated with an oscillator according to the invention.

Shifting takes place in a direction to the left. In FIG. 8 this is indicated by the curve 42 with the dotted part 43. Similarly, an excitation applied to the circuit of FIG. 5 will also cause the curve 27 in FIG. 6 to be shifted to the left. The oscillator of FIG. 3 originally operated at point P of FIG. 4, but owing to the auxiliary excitation the oscillator of FIG. 9 will operate at a different point P on the curve 42 in FIG. 8. The point P of FIG. 4 is designated P' on the curve 42.

Consequently, the slow control of the oscillator is again represented by the curve 42, whereas for rapid variations the straight line 44 is followed, which intersects the line 14 for the oscillation requirement at point P. In the other words, the line 44 represents the gain G of the amplifier 3 for rapid amplitude variations. However, G is smaller than the value that would follow from the oscillation requirement represented by the line 14.

As already stated in the known literature, a small non-linearity yields a considerable improvement in amplitude stability. Therefore, it is not necessary to select such a stability. Therefore, it is not necessary to select such a strongly reduced slope as exhibited by the curves 28 and 44 in FIGS. 4, 6 and 8. This means that the oscillator according to the invention does not require a substantial excitation. For the circuit of FIG. 9 an excitation voltage 70.1 to 0.3% of the input voltage in conjunction with the linearly operated amplifier 3 and despite the rectangular shape of the excitation voltage, amply suffices to obtain a distortion of the order of magnitude of $10^{-4}$ to $10^{-3}$.

What is claimed is:

1. A low-distortion sinusoidal oscillator, comprising frequency selective means, an amplifier circuit connected thereto having means for compensating for rapid amplitude variations that includes means for operating the amplifier in the linear region of its characteristic and with a gain factor which is smaller than the gain factor required for undamping the frequency selective means to produce sinusoidal oscillations, said oscillator further comprising means coupled to the amplifier circuit for providing a slow-acting amplitude control relative to said rapid amplitude variations, a source of auxiliary oscillations of the same frequency as the sinusoidal oscillations and of constant amplitude, and means connecting said auxiliary oscillation source to the amplifier circuit to provide positive feedback so that the auxiliary oscillation source, in conjunction with the slow-acting amplitude control means, determines the value and stability of the amplitude of the sinusoidal oscillations.

2. An oscillator as claimed in claim 1, wherein one input of the source of auxiliary oscillations is connected to an output of the amplifier circuit and one output of the auxiliary oscillation source is connected to an input of the amplifier circuit.

3. An oscillator as claimed in claim 2, wherein the source of auxiliary oscillations comprises a resistor connected to the input of the auxiliary oscillation source and to two diodes connected in anti-parallel to a point of reference potential, said diodes operating symmetrically to provide instantaneous limiting action, and means connecting the junction of the resistor and the diodes to the output of the source of auxiliary oscillations.

4. An oscillator as claimed in claim 1 wherein said frequency selective means is connected between the output and the input of the amplifier circuit to form a feedback loop and said auxiliary oscillation source includes an amplitude limiter and means coupling the input and output of the auxiliary oscillation source to the output and input, respectively, of the amplifier circuit.

5. An oscillator as claimed in claim 1 wherein said frequency selective means comprises a Wien bridge circuit connected between the output and the input of the amplifier circuit to form a feedback loop and said auxiliary oscillation source comprises a resistor connected in series with a pair of anti-parallel connected diodes across the output of the amplifier circuit with the junction of said resistor and diodes connected to an input of the amplifier circuit.

6. An oscillator for producing sinusoidal oscillations of low distortion and with a constant, stable and fast setting amplitude comprising, frequency selective means, an amplifier circuit connected thereto to form a feedback loop therewith and having a linear amplifying characteristic for instantaneous oscillation amplitude variations, means coupled to the amplifier circuit for providing a slow-acting amplitude control for the oscillations, a source of auxiliary oscillations connected to the amplifier circuit with oscillations of the same frequency and phase as the sinusoidal oscillations and of constant amplitude, means including the slow-acting amplitude control in conjunction with the auxiliary oscillation source for adjusting the amplifier circuit to an operating point such that the gain factor of the amplifier circuit at the operating point is smaller than the gain factor required for undamping the frequency selective means to produce said sinusoidal oscillations.

7. An oscillator as claimed in claim 6 wherein the output of the auxiliary oscillation source is connected to the input of the amplifier circuit and said frequency selective means is connected between the output and the input of the amplifier circuit.

8. An oscillator as claimed in claim 7 wherein said slow-acting amplitude control means includes a resistor having a selected non-linear temperature coefficient of resistance connected to the input of the amplifier circuit.

9. An oscillator as claimed in claim 7 wherein the input of the auxiliary oscillation source is connected to the output of the amplifier circuit, and said auxiliary oscillation source includes an amplitude limiter for oscillations received from the output of the amplifier circuit.

10. An oscillator as claimed in claim 7 wherein said frequency selective means comprises a Wien bridge circuit with first and second output terminals connected to first and second input terminals respectively of the amplifier circuit to supply thereto a positive feedback voltage that is frequency dependent and a negative feedback voltage that is frequency independent, respectively, and said auxiliary oscillation source provides positive feedback oscillations that support the oscillations produced at the output of the amplifier circuit.

* * * * *